(12) United States Patent
Mignot et al.

(10) Patent No.: US 10,062,605 B2
(45) Date of Patent: *Aug. 28, 2018

(54) VIA AND CHAMFER CONTROL FOR ADVANCED INTERCONNECTS

(71) Applicant: INTERNATIONAL BUSINESS MACHINES CORPORATION, Armonk, NY (US)

(72) Inventors: Yann A. M. Mignot, Slingerlands, NY (US); Theodorus E. Standaert, Clifton Park, NY (US); Chih-Chao Yang, Glenmont, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/589,229

(22) Filed: May 8, 2017

(65) Prior Publication Data

US 2018/0096887 A1 Apr. 5, 2018

Related U.S. Application Data

(63) Continuation of application No. 15/282,012, filed on Sep. 30, 2016, now Pat. No. 9,691,659.

(51) Int. Cl.
*H01L 21/768* (2006.01)
*H01L 21/311* (2006.01)

(52) U.S. Cl.
CPC .. *H01L 21/76844* (2013.01); *H01L 21/31144* (2013.01); *H01L 21/76802* (2013.01); *H01L 21/76846* (2013.01)

(58) Field of Classification Search
CPC ......... H01L 21/76844; H01L 21/76802; H01L 21/31144; H01L 21/76846
See application file for complete search history.

(56) References Cited

U.S. PATENT DOCUMENTS 9,691,659 B1 * 6/2017 Mignot ............. H01L 21/02063

OTHER PUBLICATIONS

List of IBM Patents or Patent Applications Treated as Related; (Appendix P), Date Filed May 9, 2017; 2 pages.
Yann A.M. Mignot et al., Pending U.S. Appl. No. 15/282,012 entitled "Via and Chamfer Control for Advanced Interconnects," filed Sep. 30, 2016.

* cited by examiner

*Primary Examiner* — Long Pham
(74) *Attorney, Agent, or Firm* — Cantor Colburn LLP; Vazken Alexanian (57) ABSTRACT

Methods of forming a semiconductor structure includes etching a via opening through an interlevel dielectric to a metal conductor. A contiguous metal liner is deposited onto exposed surfaces of the substrate. The substrate is exposed to a gaseous ion plasma to remove portions of the metal liner that are horizontally oriented and to reduce a height of the metal liner from portions thereof that are vertically oriented. Subsequently, a trench opening is formed in the interlevel dielectric, wherein the trench opening is connected with the via opening, wherein at least a portion of the metal liner remains on sidewall surfaces within the via opening during the forming of the trench opening. A diffusion barrier liner is deposited within the trench opening and the via opening. A conductive material is formed within remaining portions of the trench opening and the via opening to define the interconnect structure.

8 Claims, 7 Drawing Sheets

VIA AND CHAMFER CONTROL FOR ADVANCED INTERCONNECTS

DOMESTIC PRIORITY

This application is a CONTINUATION of U.S. patent application Ser. No. 15/282,012, filed Sep. 30, 2016, the disclosure of which is incorporated by reference herein in its entirety.

BACKGROUND

The present invention generally relates to semiconductor integrated circuits, and more particularly, to the structure and formation of interconnect structures.

Generally, semiconductor devices include a plurality of circuits which form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant that is less than silicon dioxide.

SUMMARY

The invention is generally directed to methods for forming an interconnect structure in semiconductor structures.

In one or more embodiments, a method of forming a semiconductor structure includes forming a first dielectric material including a metal conductor embedded therein on a substrate. A second dielectric material is formed above the first dielectric material and the at least one conductive region, wherein a via opening is formed in the second dielectric material. A metal liner is formed on exposed surfaces within the via opening located in the second dielectric material. The substrate is exposed to a gaseous ion plasma to remove portions of the metal liner that are horizontally oriented and to reduce a height of the metal liner from portions thereof that are vertically oriented. Then, a trench opening is formed in the second dielectric material, wherein the trench opening is connected with the via opening, wherein at least a portion of said metal liner remains on sidewall surfaces within the via opening during said forming of the trench opening. A diffusion barrier liner is formed within the trench and via openings. A conductive material is formed within the trench and via openings.

In one or more embodiments, a method of forming a semiconductor structure includes forming a first dielectric material including a metal conductor embedded therein on a substrate. A second dielectric material is formed above the first dielectric material and the at least one conductive region. A stack of masking materials is formed on the second dielectric layer, wherein the stack of masking materials includes, from bottom to top, a dielectric capping material layer, a dielectric hardmask material layer, and a metal hardmask material layer. The metal hardmask material layer is patterned to define a pre-opened pattern for a trench opening. A plurality of features is formed on the stack of masking materials. An organic planarizing layer is formed onto the stack of masking materials encapsulating the plurality of features. A via opening is formed from the organic planarizing layer to the metal conductor. The organic planarizing layer is removed and a metal liner is formed on exposed surfaces. The substrate is exposed to a gaseous ion plasma to remove portions of the metal liner that are horizontally oriented and to reduce a height of the metal liner from portions thereof that are vertically oriented. The trench opening is formed from the pattern defined by the metal hardmask material layer into the second dielectric material, wherein the trench opening is connected with the via opening, wherein at least a portion of the metal liner remains on sidewall surfaces within the via opening during the forming of the trench opening. The stack of masking materials is removed. A diffusion barrier liner is formed within the trench opening and the via opening. A conductive material is formed the trench and via opening to define an interconnect structure.

In one or more embodiments, a method of forming a interconnect structure in a semiconductor substrate includes etching a via opening through an interlevel dielectric to a metal conductor. A contiguous metal liner is deposited on exposed surfaces including surfaces defined by the via opening. The substrate is exposed to a gaseous ion plasma to remove portions of the metal liner that are horizontally oriented and to reduce a height of the metal liner from portions thereof that are vertically oriented. A trench opening is formed in the interlevel dielectric, wherein the trench opening is connected with the via opening, wherein at least a portion of the metal liner remains on sidewall surfaces within the via opening during the forming of the trench opening. A diffusion barrier liner is formed within the trench and via openings. A conductive material is formed within the trench and via openings to define the interconnect structure.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention generally provides interconnect structures and processes for forming the interconnect structures that generally include addition of a metal liner to a via between the via etch and trench etch, i.e., metal liner deposition in the via prior to trench formation. As will be discussed in greater detail below, the addition of the metal liner to the via between the via etch and the trench etch has been found to significantly improve chamfer control as well as improve minimal insulator spacing between vias in the non-SAV direction, among other advantages. Moreover, the deposition of the metal liner can be utilized in multi- or single via patterning schemes. In prior art integration schemes, the via portions of the interconnect structure are typically not protected during the trench dielectric etch, i.e., during formation of the metal lines. As such, the trench dielectric etch will sputter the top corner and attack the via sidewalls, which can result in rounded profiles, i.e., chamfering, of the top corners of the via. This problem is now depicted in FIG. 1, which illustrates a prior art non-SAV dual damascene interconnect structure 100. Specifically, the interconnect structure 100 includes a first dielectric material 102 including a plurality of conductive regions 106 embedded therein. Each conductive region 106 is separated from the first dielectric material 102 by a diffusion barrier 104. The prior art interconnect structure further includes a dielectric capping layer 107 which includes openings that expose surfaces of some of the underlying conductive regions 106. Atop the dielectric capping layer 107 there is present a second dielectric material 108 that has a chamfered profile (e.g., rounded corners) 110 present in a dielectric material portion 108A of second dielectric material 108 which is present between two adjacent vias 112A, 112B. The chamfered profile 110 can also be referred to herein as simply a rounded profile 110. Atop and connecting the two adjacent vias 112A, 112B there is present a trench 114. The vias 112A, 112B and the trench 114 include a second diffusion barrier 116 that lines sidewalls of the vias 112A, 112B, and the line 114 and they are filled with a conductive material 118. In such interconnect structure, the line-to-line spacing, A, is no longer always the minimum distance between interconnects. Instead, it has been observed that the profile of the dielectric material portion 108A located between adjacent vias 112A, 112B now defines the minimum distance, B, in such interconnect structure.

Figure 1:
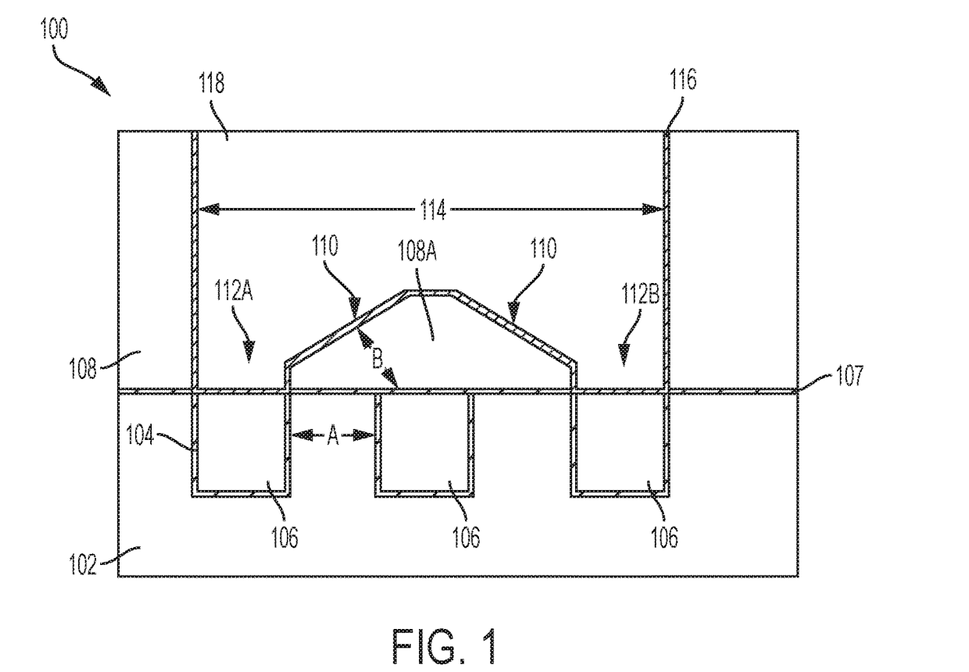
FIG. 1 is a pictorial representation (through a cross sectional view) illustrating a prior art dual damascene interconnect structure in which profile tapering occurs to a dielectric material portion which is present between two adjacent conductively filled vias.

The degree of chamfering of a given integration scheme can be measured in several ways as is generally known in the art. One way is to measure the chamfer by the angle of the profile 110 relative to the dielectric layer 107. Generally less than 80 degrees is not desirable, which can lead to short issues.

Figure 2:
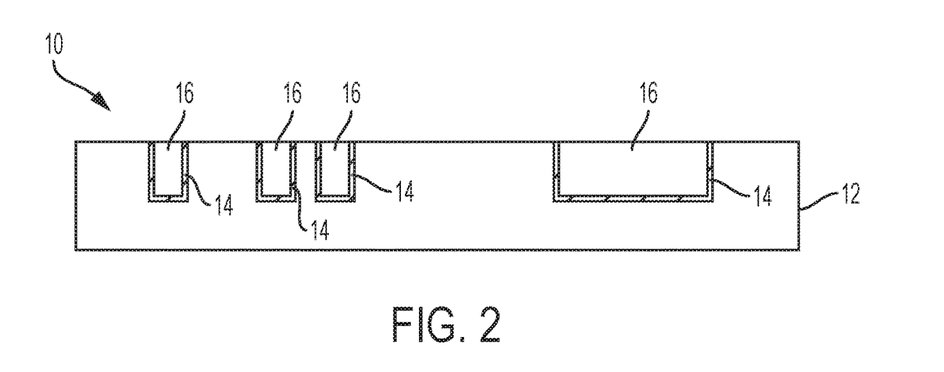
FIG. 2 is a pictorial representation (through a cross sectional view) illustrating a first dielectric material including regions of conductive material embedded therein.

In the present invention, the profile of a via can be controlled by forming a relatively thin metal liner within each via opening that is formed into a dielectric material prior to forming a trench opening, i.e., line opening, within the dielectric material. The presence of the liner within each via opening during the formation of the line opening protects the dielectric material and minimizes rounding of the corners of the dielectric material portion that is present between the line opening and adjacent the via opening, which can be significant for non-SAV direction. For the SAV direction, the presence of the liner material helps maintain the critical dimension of the vias during the trench etch by reducing damage to the dielectric material. Referring to FIG. 2, there is illustrated an initial structure 10 that can be employed in one or more embodiments. The initial structure shown in FIG. 2 represents a first level of an interconnect structure. The initial structure that can be employed can include a first dielectric material 12 that has at least one region of a conductive material 16 embedded, i.e., a metal conductor. Each region of conductive material 16 is separated from the first dielectric material 12 by a diffusion barrier 14. The initial structure 10 includes a planar top surface. The first dielectric material 12 is typically located upon a substrate (not shown in the drawings of the present application). The substrate, which is not shown, can include a semiconducting material, an insulating material, a conductive material or any combination including multilayers thereof. When the substrate includes a semiconducting material, any semiconductor such as, for example, Si, SiGe, SiGeC, SiC, Ge alloys, GaAs, InAs, InP and other III/V or II/VI compound semiconductors can be used. In addition to these listed types of semiconducting materials, the semiconductor substrate can be a layered semiconductor such as, for example, Si/SiGe, Si/SiC, silicon-on-insulators (SOIs) or silicon germanium-on-insulators (SGOIs). In one or more embodiments, the semiconducting material can include one or more semiconductor devices such as, for example, complementary metal oxide semiconductor (CMOS) devices fabricated thereon.

When the substrate is an insulating material, the insulating material can be an organic insulator, an inorganic insulator or a combination thereof including multilayers. When the substrate is a conducting material, the substrate can include, for example, polySi, an elemental metal, alloys of elemental metals, a metal silicide, a metal nitride or combinations thereof including multilayers.

When the substrate includes a combination of an insulating material and a conductive material, the substrate can represent one of interconnect levels of a multilayered interconnect structure.

The first dielectric material 12 of the initial structure can include any interlevel or intralevel dielectric material (ILD) including inorganic dielectrics or organic dielectrics. The first dielectric material 12 can be porous, non-porous or contain regions and/or surfaces that are porous and other regions and/or surfaces that can be non-porous. Some examples of suitable dielectrics that can be used as the dielectric material 12 include, but are not limited to, silsesquioxanes, C doped oxides (i.e., organosilicates) that include atoms of Si, C, O and H, thermosetting polyarylene ethers, polyimides, polynorbornene, benzocyclobutene, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In one or more embodiments, the first dielectric material 12 has a dielectric constant that is less than silicon dioxide, i.e., less than 4.0. In another embodiment, the first dielectric material 12 that can be employed in the present invention has a dielectric constant of 3.0 or less. All dielectric constants mentioned herein are relative to a vacuum, unless otherwise noted. Dielectrics which have a dielectric constant of less than that of silicon dioxide generally have a lower parasitic cross talk as compared with dielectric materials that have a higher dielectric constant equal to, or greater than, silicon dioxide. Generally, silicon dioxide has a dielectric constant of 4.0.

The thickness of the first dielectric material 12 can vary depending upon the composition of the dielectric material used as well as the exact number of dielectric layers within the first dielectric material 12. In one or more embodiments, the dielectric material 12 has a thickness from 50 nm to 1000 nm. In other embodiments, the first dielectric material 12 can have a thickness that is greater than or less than the thickness range mentioned above. The first dielectric material 12 can be formed utilizing a deposition process such as, for example, chemical vapor deposition (CVD), plasma enhanced chemical vapor deposition (PECVD), evaporation, chemical solution deposition and spin-on coating.

In some embodiments and after forming the first dielectric material 12, a hard mask material (not shown) can be formed on an exposed surface of dielectric material 12. In other embodiments, the hard mask material is not employed.

When employed, the hard mask material can include an oxide, nitride, oxynitride or multilayers thereof (e.g., a stack including at least two hard mask materials). In one embodiment, the hard mask material includes a semiconductor oxide such as, for example, silicon dioxide. In another embodiment, the hard mask includes a stack of an oxide hard mask material such as, for example, silicon dioxide, and a nitride hard mask material such as, for example, silicon nitride. In some embodiments, the hard mask material can be formed utilizing a deposition process including, for example, CVD, PECVD, evaporation, chemical solution deposition, physical vapor deposition (PVD) and atomic layer deposition (ALD). In other embodiments, the hard mask material can be formed by a thermal process such as, for example, thermal oxidation, and/or thermal nitridation. In yet other embodiments, the hard mask material can be formed utilizing a combination of deposition and thermal processes. The thickness of the hard mask material can vary depending on the composition of the hard mask material itself as well as the technique that was used in forming the same. Typically, the hard mask material has a thickness from 10 nm to 80 nm.

Next, at least one opening can be formed into the first dielectric material 12. In one embodiment, the hard mask material is employed as a pattern mask. The at least one opening can include a via opening, a line opening, a combined via and line opening, or any combination thereof. A via opening can be distinguished from a line opening in that the via opening has a narrower width than the line opening.

In one embodiment and as shown in FIG. 2, the at least one opening extends partially through the first dielectric material 12. In another embodiment (not shown), the at least one opening can extend entirely through the first dielectric material 12, i.e., from the upper surface of the first dielectric material 12 to the bottom surface of the first dielectric material 12. In some embodiments, a first set of openings can extend partially through the first dielectric material 12, while a second set of openings can extend entirely through the first dielectric material 12.

The at least one opening can formed by lithography and etching. The lithographic step can include forming a photoresist (organic, inorganic or hybrid) atop the first dielectric material 12. In one embodiment, the photoresist can be formed directly on the upper surface of the first dielectric material 12. In another embodiment, and when the hard mask material is present, the photoresist can be formed directly on the upper surface of the hard mask material. The photoresist can be formed utilizing a deposition process such as, for example, CVD, PECVD and spin-on coating. Following formation of the photoresist, the photoresist is exposed to a desired pattern of radiation. Next, the exposed photoresist is developed utilizing a conventional resist development process.

After the development step, an etching step can be performed to transfer the pattern from the patterned photoresist into at least the first dielectric material 12. In one embodiment, and when the hard mask material is present, the pattern can be first transferred into the hard mask material and then into the first dielectric material 12. In such an embodiment, the patterned photoresist is typically, but not necessarily always, removed from the surface of the structure after transferring the pattern into the hard mask material utilizing a resist stripping process such as, for example, ashing. The etching step used in forming the at least one opening can include a dry etching process (including, for example, reactive ion etching, ion beam etching, plasma etching or laser ablation), a wet chemical etching process or any combination thereof. In one embodiment, reactive ion etching is used to form the at least one opening.

Each opening that is formed into the first dielectric material 12 is then filled with a diffusion barrier material 14 and a conductive material. As illustrated in FIG. 2, the diffusion barrier 14 and each region of conductive material 16 have an upper surface that is coplanar with an upper surface of the first dielectric material 12. The diffusion barrier 14 that is within the each of the openings has a U-shaped cross section as shown. The term "U-shaped" as used throughout the present invention denotes any contiguous material such as diffusion barrier 14 that includes two vertical portions which upward extend from a horizontal connecting portion.

The diffusion barrier 14 can include any material that can serve as a barrier to prevent conductive material ions from diffusing into the first dielectric material 12. Examples of materials that can be used as diffusion barrier 14 include, for example, Ta, TaN, Ti, TiN, Ru, RuN, RuTa, RuTaN, IrTa, IrTaN, W, WN or a multilayered stack thereof. The thickness of the diffusion barrier 14 can vary depending on the deposition process used as well as the material employed. Typically, the diffusion barrier 14 has a thickness from 4 nm to 40 nm, with a thickness from 7 nm to 20 nm being more typical. The diffusion barrier 14 can be formed by a deposition process including, for example, CVD, PECVD, PVD, sputtering and plating.

Each region of conductive material 16 includes for example, polySi, SiGe, a conductive metal, an alloy including at least two conductive metals, a conductive metal oxide, a conductive metal nitride, a conductive metal silicide or any combination thereof. In one embodiment, each region of conductive material 16 can include Al, W, Cu and/or a Cu alloy (such as AlCu). Each region of conductive material 16 can be formed by a deposition process including, for example, CVD, PECVD, PVD, sputtering, plating, chemical solution deposition and electroless plating.

After deposition of each of the diffusion barrier 16 and the conductive material, any excess diffusion barrier material and conductive material that is located outside of the at least one opening can be removed by a planarization process. In one embodiment, the planarization process includes chemical mechanical polishing (CMP). In another embodiment, the planarization process includes grinding. In a further embodiment, the planarization process includes a combination of CMP and grinding. In some embodiments and when a hard mask material is employed, the planarization process also removes remaining portions of the hard mask material that are located outside the opening and on the upper surface of first dielectric material 12.

Figure 3:
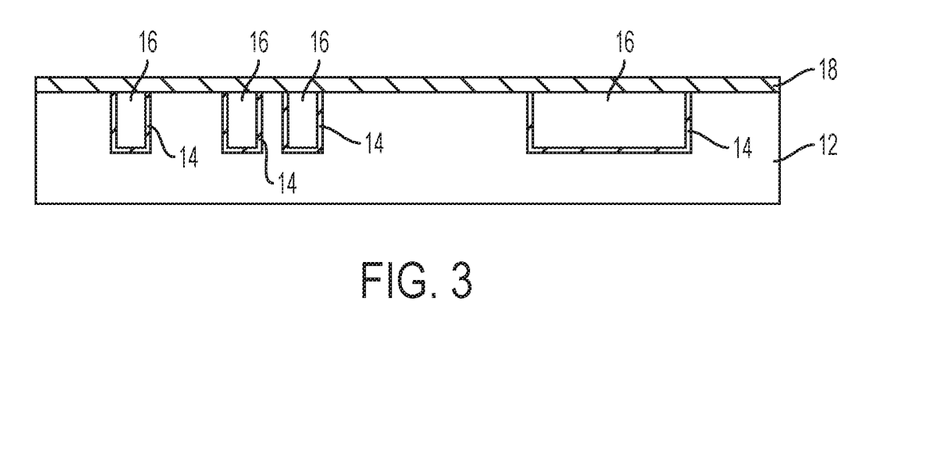
FIG. 3 is a pictorial representation (through a cross sectional view) illustrating the structure of FIG. 2 after forming a dielectric capping layer on an exposed surface of the first dielectric material as well as an exposed surface of each region of conductive material.

Referring now to FIG. 3, there is illustrated the structure of FIG. 2 after blanket depositing a first dielectric capping layer 18 onto the planar surface provided by the initial structure 10. The dielectric capping layer 18 can be formed utilizing a deposition process such as, for example, CVD, PECVD, chemical solution deposition, or evaporation. The dielectric capping layer 18 can include any suitable dielectric capping material such as, for example, SiC, Si3N4, SiO2, a carbon doped oxide, a nitrogen and hydrogen doped silicon carbide SiC(N,H) or multilayers thereof. The thickness of the dielectric capping layer 18 can vary depending on the technique used to form the same as well as the material make-up of the layer. Typically, the dielectric capping layer 18 has a thickness from 15 nm to 55 nm, with a thickness from 25 nm to 45 nm being more typical.

Figure 4:
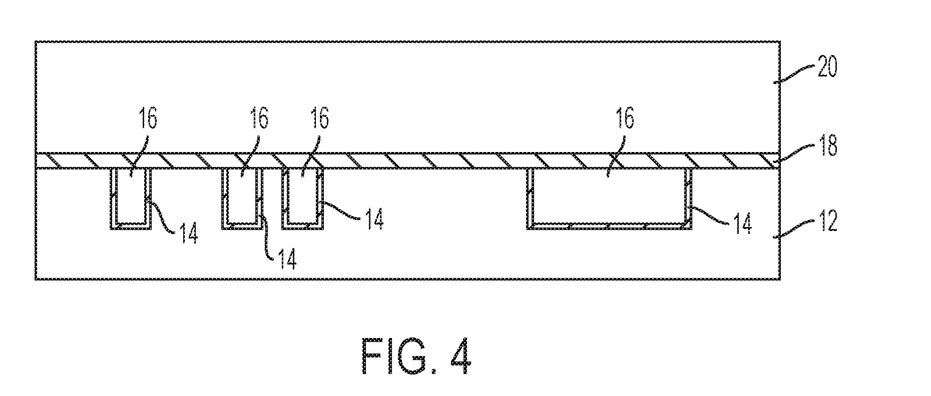
FIG. 4 is a pictorial representation (through a cross sectional view) illustrating the structure of FIG. 3 after forming a second dielectric material on an exposed surface of the dielectric capping layer.

Referring to FIG. 4, there is illustrated the structure of FIG. 3 after forming a second dielectric material 20 on an exposed surface of the dielectric capping layer 18. The second dielectric material 20 serves as a second level of the interconnect structure of the present description. In one or more embodiments, the second dielectric material 20 can include the same dielectric material as that of the first dielectric material 12 or can be a different dielectric material as that of the first dielectric material 12. The second dielectric material 20 can be formed utilizing one of the deposition techniques mentioned above in forming the first dielectric material 12. The thickness of the second dielectric material 20 can be within the ranges mentioned above for the first dielectric material 12.

Figure 5:
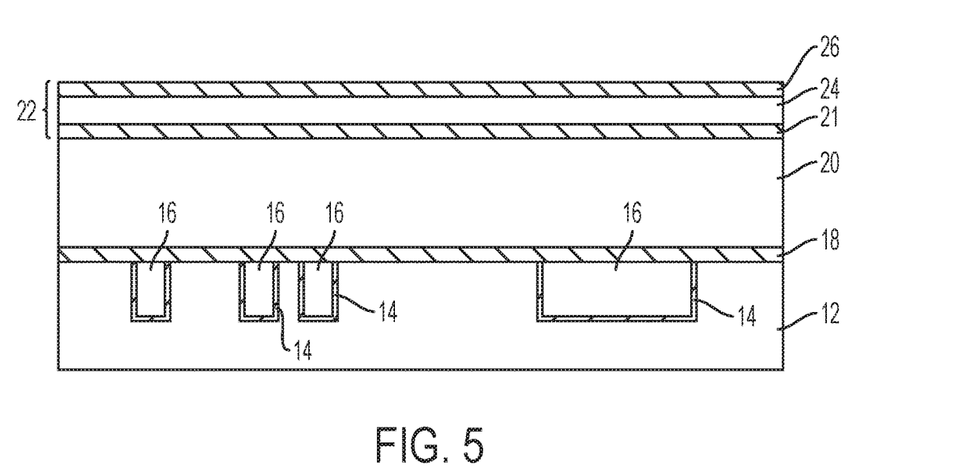
FIG. 5 is a pictorial representation (through a cross sectional view) illustrating the structure of FIG. 4 after forming a stack of mask materials including, from bottom to top, a dielectric hard mask material and a metal mask material on an exposed surface of the second dielectric material.

Referring to FIG. 5, there illustrated the structure of FIG. 4 after forming a stack of mask materials 22 including, from bottom to top, a cap layer 21, a dielectric hard mask material 24 and a metal mask material 26 on an exposed surface of the second dielectric material 20.

The dielectric capping layer 21 can include any suitable dielectric capping material such as, for example, SiC, Si3N4, SiO2, a carbon doped oxide, a nitrogen and hydrogen doped silicon carbide SiC(N,H) or multilayers thereof. The thickness of the dielectric capping layer 18 can vary depending on the technique used to form the same as well as the material make-up of the layer. Typically, the dielectric capping layer 18 has a thickness from 15 nm to 55 nm, with a thickness from 25 nm to 45 nm being more typical.

The dielectric hard mask material 24 includes one of the materials mentioned above for the hard mask material that can be used in forming the at least one opening within the first dielectric material 12. The dielectric hard mask material 24 can be formed utilizing one of the techniques mentioned above that could be used for forming the hard mask material on the first dielectric material 12. The thickness of the dielectric hard mask material 24 is typically within a range from 5 nm to 80 nm, with a thickness from 10 nm to 40 nm being more typical.

The metal mask material 26 of the stack of mask materials 22 can include for example, Ta, TaN, Ti, TiN, W, and/or WN. The metal mask material 26 can be formed utilizing CVD, PECVD, PVD, sputtering and plating. The thickness of the metal mask material 26 is typically within a range from 4 nm to 70 nm, with a thickness from 8 nm to 40 nm being more typical.

Figure 6:
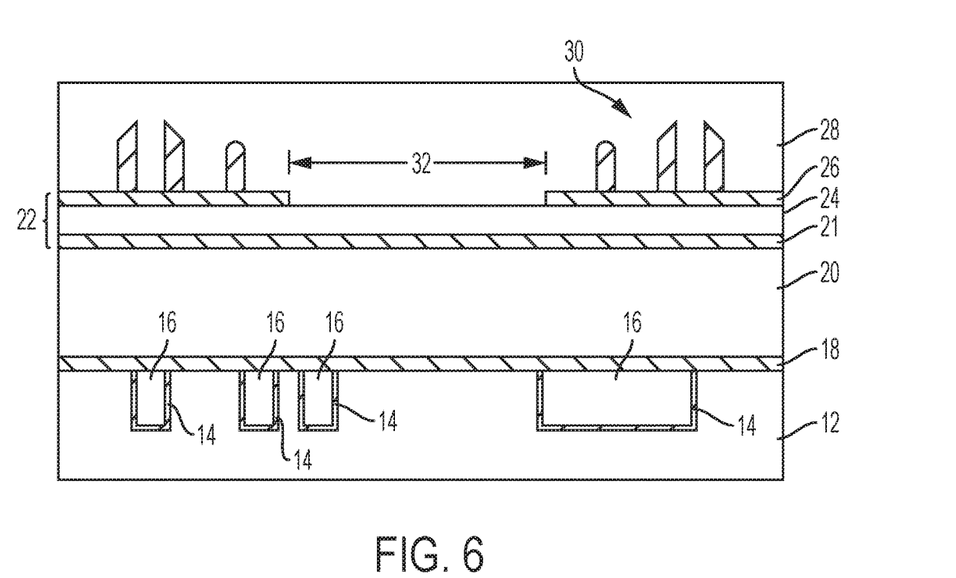
FIG. 6 is a pictorial representation (through a cross sectional view) illustrating the structure of FIG. 5 after pre-opening the line pattern feature by selective patterning of the metal hardmask in the stack of mask materials, forming various features on the stack of mask materials and depositing an organic planarizing layer thereon.

Referring to FIG. 6, there is illustrated the structure of FIG. 5 after pre-opening the line (trench) pattern 32 as shown by selective patterning of the metal hardmask 26 in the stack of mask materials 22, formation of various features 30 on the stack of mask materials 22, and after formation of an organic planarizing layer 28 overlaying various patterned features 30 formed on the stack of mask materials 22 using prior art techniques such as a litho-etch (LE) process, a LE2 process, a LE3 process, a self-aligned double patterning (SADP) process, or a self-aligned quadruple patterning (SAQP) process, for example. In FIG. 6, the patterned features have been formed using a sidewall image transfer (SIT or SADP) process.

Pre-opening the liner pattern 32 can be formed into the metal mask material 26 by a first lithography step in which a first photoresist material is applied to an exposed surface of the metal mask material 26. The first photoresist material is then exposed to a line (or trench) pattern of radiation and then the exposed photoresist is developed utilizing a conventional resist developer. The line pattern that is formed into the first photoresist is then transferred to the metal mask material 26 utilizing an etching process which selectively removes the exposed portions of the metal mask material, stopping at an upper surface of the dielectric hard mask material 24. In one embodiment, the line pattern 32 can be transferred from the patterned first photoresist into the metal mask material 26 by reactive ion etching. In some embodiments, the reactive ion etch can include chlorine chemistry. After transferring the line pattern to the metal mask material 26, the patterned first photoresist material is removed utilizing a conventional resist stripping process such as, for example, ashing.

The organic planarizing layer 28 is typically a carbon based material having a dielectric constant of about 4.0 or less. In one or more embodiments, the dielectric constant is less than about 3.0. Exemplary materials defining the organic planarizing layer that can be employed in the invention include, but are not limited to: diamond-like carbon (DLC), fluorinated DLC, polyimides, fluorinated polyimides, parylene-N, parylene-F, benzocyclobutanes, poly(arylene ethers), polytetrafluoroethylene (PTFE) derivatives marketed by Du Pont de Nemours, Inc. under the registered trademark Teflon AF, poly(naphthalenes), poly (norbornenes), foams of polyimides, organic xerogels, porous PTFE and other nano-, micro- or macro-porous organic materials.

The organic dielectric material can formed on the surface of substrate 10 using conventional deposition techniques as generally discussed above. For example, chemical vapor deposition, plasma vapor deposition, sputtering, dip coating, spin-on coating, brushing, spraying and other like deposition techniques can be employed. The resultant organic dielectric layer preferably has a thickness of about 500 (☐) Angstroms to 10,000☐, more preferably, about 2000☐ to 9000☐.

Figure 7:
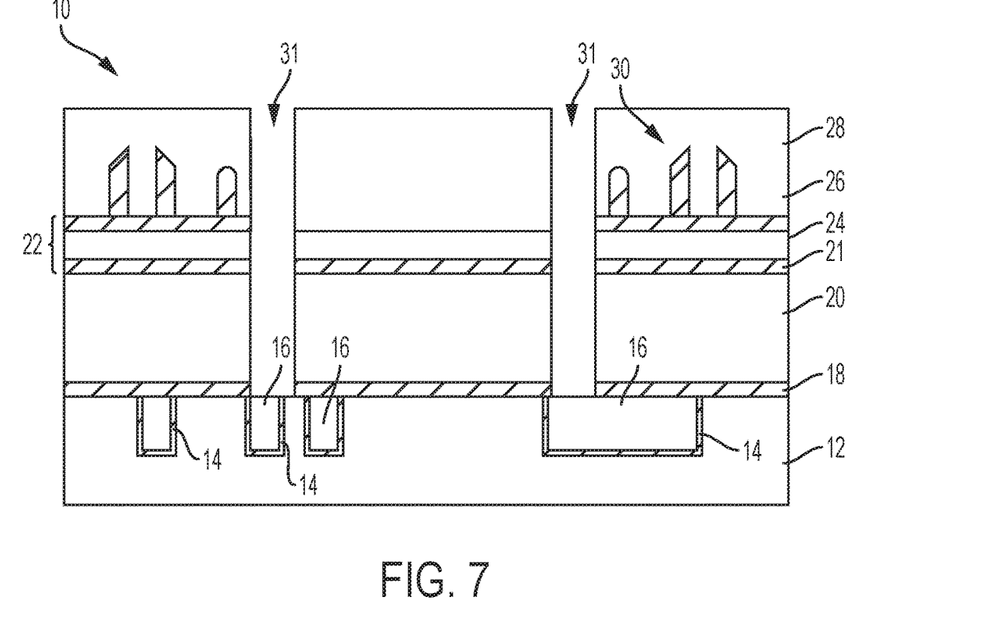
FIG. 7 is a pictorial representation (through a cross sectional view) illustrating the structure of FIG. 6 after via formation.

Referring to FIG. 7, there is illustrated the structure of FIG. 6 after formation of via openings using a via litho pattern 31 including different anisotropic etch chemistries having a desired selectivity for the particular material being removed. For example, plasma etching utilizing CH2F2 and H2/N2 etch chemistries can be used to etch through the top mask and organic planarizing layer. The bottom cap layer 18 can be opened utilizing fluorine based etch chemistries such as CF4 etch chemistry along with argon and trace amounts of NF3.

Figure 8:
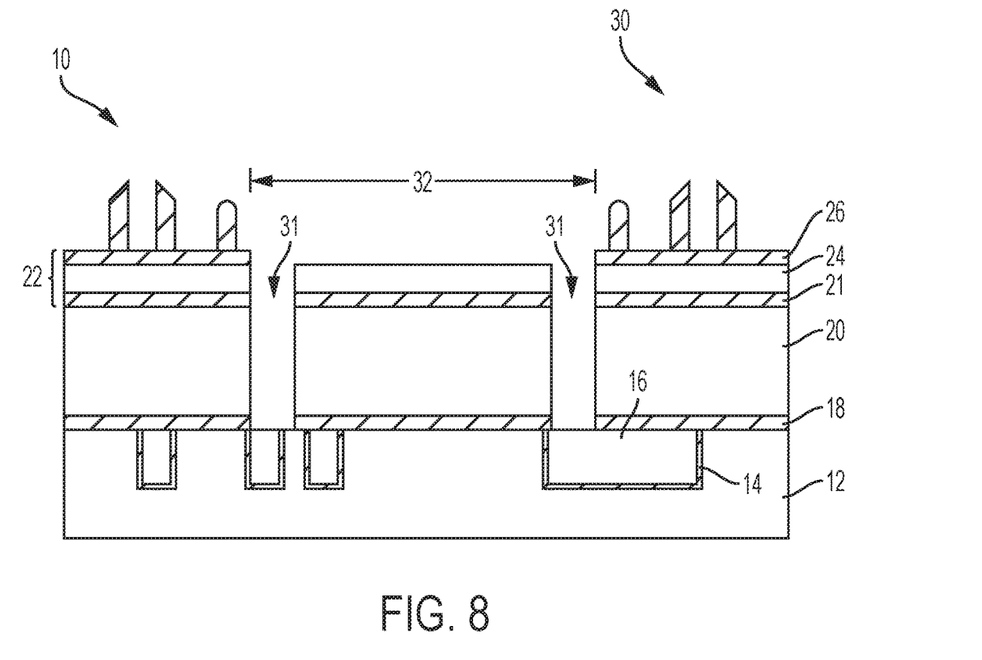
FIG. 8 is a pictorial representation (through a cross sectional view) illustrating the structure of FIG. 7 after removal of the organic planarizing layer.

Referring to FIG. 8, there is illustrated the structure of FIG. 7 after removal of the organic planarizing layer 28.

In one or more embodiments, each via opening 31 that is formed extends entirely through the second dielectric material exposing an upper surface of the dielectric capping layer as shown. In one or more other embodiments, each via opening 31 does not extend entirely through the second dielectric material 20. In such an embodiment, a remaining portion of the second dielectric material 20 can be present between the bottom of each via opening 31 and the upper surface of the dielectric capping layer 18. In one or more other embodiments, some via openings 31 can extend entirely through the second dielectric material 20, while other via openings only extend partially through the second dielectric material.

Figure 9:
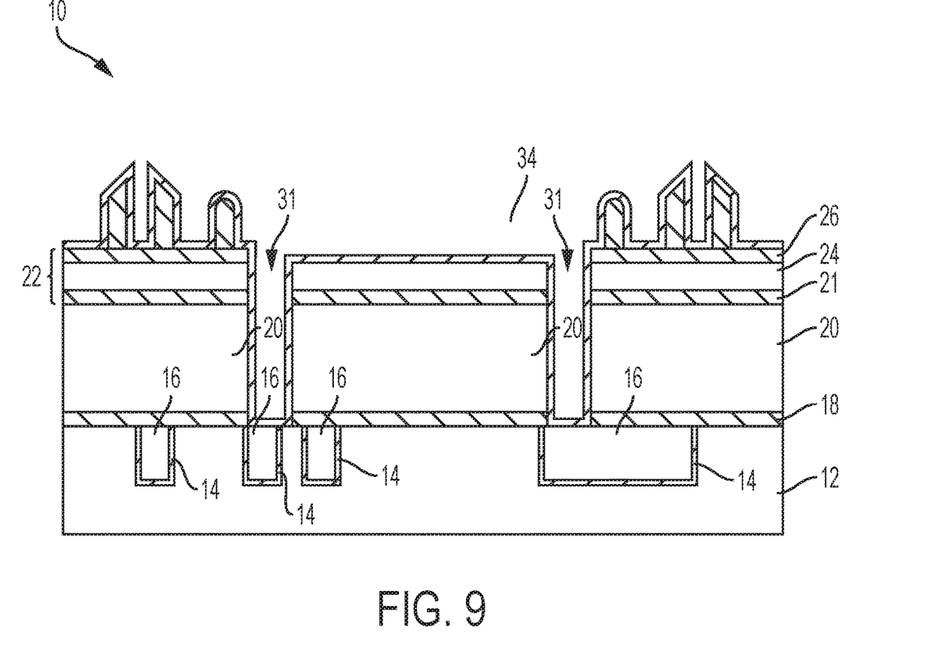
FIG. 9 is a pictorial representation (through a cross sectional view) illustrating the structure of FIG. 8 after formation of a metal liner on the substrate.

Referring to FIG. 9, there is illustrated the structure of FIG. 8 after forming a metal liner 34 within each via opening 31 and on an exposed surface of remaining portions of the stack of mask materials 22 and features 30 thereon. At this point of the present invention, the metal liner 34 is a contiguous liner material that covers all exposed surfaces of the structure shown.

Examples of suitable materials that can be used as the metal liner 34 include, but are not limited to, Ta, TaN, Ti, TiN, Ru, RuN, RuTa, RuTaN, IrTa, IrTaN, W, and/or WN. The metal liner 34 can be formed by CVD, PECVD, PVD, sputtering and plating. The thickness of the metal liner 34 that can be used in the present invention is typically from 1 nm to 20 nm, with a thickness from 2 nm to 5 nm being even more typical.

Figure 10:
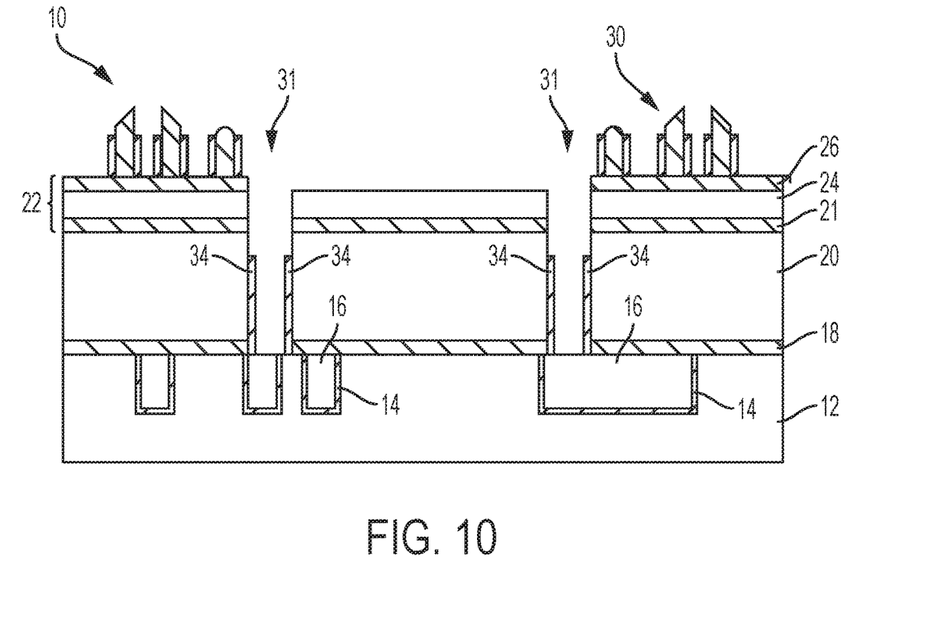
FIG. 10 is a pictorial representation (through a cross sectional view) illustrating the structure of FIG. 9 after exposing the substrate to a gaseous ion plasma to remove portions of the metal liner that are horizontally oriented and to reduce a height of the metal liner from portions thereof that are vertically oriented.

Referring now to FIG. 10, there is illustrated the structure of FIG. 9, subsequent to an anisotropic liner erosion process to remove portions of the metal liner 34 that are horizontally oriented and to reduce a height of the metal liner from portions thereof that are vertically oriented. The metal liner erosion process open the bottoms of the vias, i.e., removes the liner from the bottom surface of the via openings 32, thereby exposing the metal conductors 16 in embodiments where the via opening extends to the metal conductors. In one or more other embodiments, the dielectric 20 is opened in embodiments where the via opening 32 does not extend to the metal conductor 16.

In the anisotropic liner erosion process, the entire structure 10 is exposed/bombarded with a gaseous ion plasma (e.g., Ar, He, Ne, Xe, N2, H2, NH3, N2H2, etc.) to anisotropically remove the metal liner layer from most surfaces of the structure with the exception of vertical sidewalls. By way of example, a radiofrequency (RF) sputter of argon gas can be utilized to produce large energetic ions of argon that physically dislodge or otherwise eliminate exposed metal liner to provide the metal liner structure as shown in FIG. 10.

Figure 11:
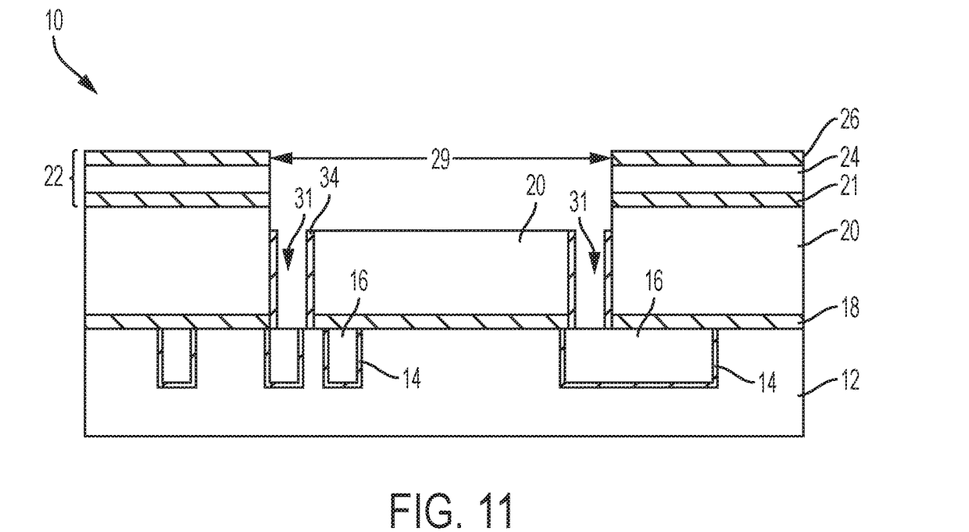
FIG. 11 is a pictorial representation (through a cross sectional view) illustrating the structure of FIG. 10 after line patterning.

Referring now to FIG. 11, there is depicted the structure of FIG. 10 after dielectric etch in the SAV direction to form line pattern 29 in the second dielectric layer 20 and after a post wet cleaning step to remove the stack of mask materials 22 remaining on the second dielectric layer 20 adjacent the line pattern 29.

The transferring of the line pattern 29 into the second dielectric material 20 includes an etching process such as, for example, reactive ion etching, plasma etching, ion beam etching or the like. The presence of the metal liner 34 within each via opening 31 prevents rounding of the corners of the second dielectric material portion 20 that is present between adjacent vias openings 31. The second dielectric material portion 20 that is present between adjacent vias openings 31 has sidewall surfaces that are protected by a remaining portion of the metal liner 34, while the upper surface of the second dielectric material portion therebetween is bare. As shown, the line opening 29 is located above and is connected with each via opening 31. It also noted that during this step, no metal liner 34 is present on any surfaces of the second dielectric material 20 within the line opening 29.

Figure 12:
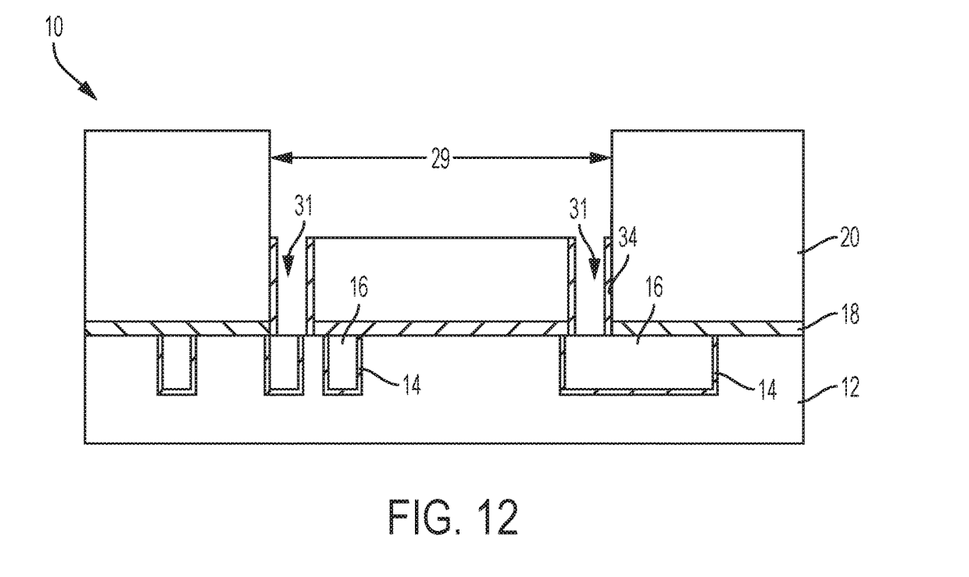
FIG. 12 is a pictorial representation (through a cross sectional view) illustrating the structure of FIG. 11 after removal of the remaining stack of mask materials.

Referring to FIG. 12, there is illustrated the structure of FIG. 11 after removal of the stack of mask materials 22 remaining on the dielectric layer 20 including, from bottom to top, the cap layer 21, the dielectric hard mask material 24 and the metal mask material 26. Removal can be by a wet clean process. A portion of the metal liner 34 on the via sidewalls is shown remaining.

Figure 13:
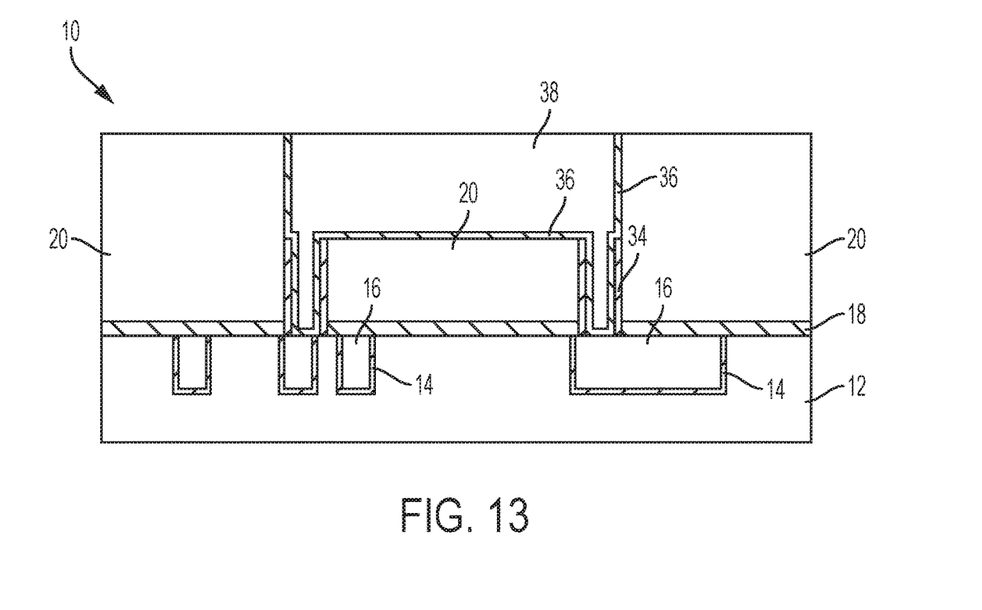
FIG. 13 is a pictorial representation (through a cross sectional view) illustrating the structure of FIG. 12 after formation of a barrier layer in the via and trench features followed by deposition of a conductive metal to form the interconnect structure The detailed description explains the preferred embodiments of the invention, together with advantages and features, by way of example with reference to the drawings.

Referring now to FIG. 13, there are illustrated the structure of FIG. 12, after forming a diffusion barrier 36 and a conductive material 38 within each via opening 31 and line opening 29 followed by planarizing. After planarization, the via openings 31 and the line opening 29 are filled with conductive material 38 providing conductively filled vias and a conductively filled line within the second dielectric material 20 and to define the interconnect structure.

Diffusion barrier 36 that is formed within each via opening 31 and line opening 29 can include one of the materials mentioned above for diffusion barrier 14. Diffusion barrier 36 can be formed utilizing one of the techniques mentioned above for forming diffusion barrier 14. Also, diffusion barrier 36 can have a thickness within one of the ranges mentioned above for diffusion barrier 14. In one or more embodiments, the thickness of the diffusion barrier can be reduced as the narrow features are already protected with eh metal liner 34, which can reduce the liner thickness at the bottom portion of the via.

In some embodiments (now shown), an optional plating seed layer can be formed on an exposed surface of the diffusion barrier 36 prior to forming the conductive material. The optional plating seed layer is employed to selectively promote subsequent electroplating of a pre-selected conductive metal or metal alloy. The optional plating seed layer can include Cu, a Cu alloy, Ir, an Ir alloy, Ru, a Ru alloy (e.g., TaRu alloy) or any other suitable noble metal or noble metal alloy having a low metal-plating over potential. Typically, Cu or a Cu alloy plating seed layer is employed, when a Cu metal is to be subsequently formed within the at least one opening. The thickness of the optional seed layer can vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, and PVD.

The conductive material 38 that is formed within each via opening 31 and line opening 29 can be formed by a deposition process including chemical vapor deposition (CVD), plasma enhanced chemical vapor deposition (PECVD), sputtering, chemical solution deposition or plating that fills the first and second interconnect patterns from the bottom upwards. In one embodiment, a bottom-up plating process is employed in forming the conductive material. The conductive material 38 that can include a conductive metal, an alloy including at least one conductive metal, a conductive metal silicide or combinations thereof. In one or more embodiments, the conductive material 38 is a conductive metal such as Cu, W or Al. In other embodiments, the conductive material 38 is Cu or a Cu alloy (such as Cu—Al).

Following the deposition of the conductive material 38 and the diffusion barrier 36, a planarization process such as, for example, chemical mechanical polishing (CMP) and/or grinding, can be used to form the structure The planarization process removes all material, including, portions of the conductive material 38 known as the overburden, portions of the diffusion barrier 34, and portions of the optional plating seed layer, which can be present on the upper horizontal surface of the interlevel dielectric 20.

All ranges described herein are inclusive of the endpoints, and the endpoints are combinable with each other.

All cited patents, patent applications, and other references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

While the present invention has been described in terms of specific embodiments, it is evident in view of the foregoing description that numerous alternatives, modifications and variations will be apparent to those skilled in the art. Each of the various embodiments of the present invention can be implemented alone, or in combination with any other embodiments of the present invention unless expressly described otherwise or otherwise impossible as would be known to one of ordinary skill in the art. Accordingly, the present invention is intended to encompass all such alternatives, modifications and variations which fall within the scope and spirit of the present invention and the following claims.

What is claimed is:

1. A method of forming a semiconductor structure, the method comprising:
    forming a first dielectric material including a metal conductor embedded therein on a substrate;
    forming a second dielectric material above the first dielectric material and the metal conductor;
    etching a via opening in the second dielectric material to the metal conductor embedded in the first dielectric material;
    forming a metal liner on exposed surfaces within the via opening located in the second dielectric material;
    anisotropically removing portions of the metal liner that are horizontally oriented and reducing a height of the metal liner from portions thereof that are vertically oriented;
    etching a trench opening in the second dielectric material, wherein the trench opening is connected with the via opening, wherein at least a portion of the metal liner remains on sidewall surfaces within the via opening during said forming of the trench opening and is at a height about equal to a remaining thickness of the second dielectric layer underlying the trench opening.

2. The method of claim 1, wherein exposing the substrate to the gaseous ion plasma comprises forming ions from a gas comprising argon, helium, neon, xenon, nitrogen, ammonia, forming gas, or combinations thereof.

3. The method of claim 1, wherein said second dielectric material comprises a low dielectric constant material having a k value of less than 3.9.

4. The method of claim 1, wherein said second dielectric material comprises silicon, carbon, and oxygen.

5. The method of claim 1, wherein said second dielectric material comprises pores.

6. The method of claim 1, wherein the metal liner comprises tantalum, tantalum nitride, titanium, titanium nitride, ruthenium, ruthenium nitride, ruthenium tantalum, ruthenium tantalum nitride, iridium, iridium nitride, iridium tantalum nitride, tungsten, tungsten nitride, or combinations thereof.

7. The method of claim 1, wherein the metal liner is at a thickness within a range of 1 nanometer to 20 nanometers.

8. The method of claim 1, further comprising forming a capping layer above said first dielectric material having said at least one conductive region embedded therein; and wherein exposing the substrate to the gaseous ion plasma to removes a portion of the capping layer at a bottom of the via opening.

* * * * *